(12) United States Patent
Glassman (10) Patent No.: US 7,204,918 B2
(45) Date of Patent: Apr. 17, 2007

(54) HIGH EFFICIENCY PLATING APPARATUS AND METHOD

(75) Inventor: Steven P. Glassman, Marlboro, MA (US)

(73) Assignee: Modular Components National, Inc., Forest Hill, MD (US)

( * ) Notice: Subject to any disclaimer, the term of this patent is extended or adjusted under 35 U.S.C. 154(b) by 259 days.

(21) Appl. No.: 10/385,999

(22) Filed: Mar. 10, 2003

(65) Prior Publication Data

US 2003/0150738 A1    Aug. 14, 2003

(51) Int. Cl.
*C25D 17/22* (2006.01)
*C25D 17/08* (2006.01)
*C25D 17/16* (2006.01)
*C25B 9/02* (2006.01)
*C25D 17/04* (2006.01)

(52) U.S. Cl. .......... 204/242; 204/224 M; 204/253; 204/257; 204/267; 204/269; 204/275.1; 204/279; 204/287; 205/125; 205/157; 205/640; 205/123

(58) Field of Classification Search .......... 204/224 R, 204/234, 237, 242, 244–245, 252–253, 267, 204/297.01, 297.06, 298.15, 257, 269, 275.1, 204/287; 205/123, 125, 157
See application file for complete search history.

(56) References Cited

U.S. PATENT DOCUMENTS

| | | | |
|---|---|---|---|
| 3,710,058 A * | 1/1973 | Harden, Jr. ............ 200/262 |
| 4,401,522 A | 8/1983 | Buschow et al. ......... 204/15 |
| 4,539,090 A | 9/1985 | Francis ................. 204/198 |
| 4,889,584 A | 12/1989 | Wada et al. ............ 156/630 |
| 5,417,828 A | 5/1995 | Sergio ................. 204/202 |
| 5,616,230 A | 4/1997 | Otsuka et al. .......... 205/125 |
| 5,658,441 A | 8/1997 | Spain et al. ........... 204/203 |
| 5,772,765 A | 6/1998 | Hosten ................. 118/405 |
| 5,827,410 A | 10/1998 | Hosten ................. 204/198 |
| 5,833,816 A | 11/1998 | Heermann et al. ....... 204/198 |
| 6,099,702 A * | 8/2000 | Reid et al. ............ 204/212 |
| 6,126,798 A * | 10/2000 | Reid et al. ............ 205/143 |
| 6,153,064 A | 11/2000 | Condra et al. ......... 204/198 |
| 6,165,330 A | 12/2000 | Ohba .................. 204/198 |
| 6,174,417 B1 | 1/2001 | Henington et al. ...... 204/198 |
| 6,261,425 B1 | 7/2001 | Huang et al. .......... 204/194 |
| 6,294,060 B1 | 9/2001 | Webb .................. 204/198 |
| 6,340,422 B1 | 1/2002 | DeVries ............... 205/137 |
| 6,368,482 B1 | 4/2002 | Oeftering et al. ...... 205/91 |
| 6,454,258 B1 | 9/2002 | Denys ................. 271/272 |
| 6,712,081 B1 * | 3/2004 | Uehara et al. ......... 134/105 |

* cited by examiner

Primary Examiner—Roy King
Assistant Examiner—Lois Zheng
(74) Attorney, Agent, or Firm—Larry J. Guffey (57) ABSTRACT

An improved apparatus for treating plate-like workpieces with a designated chemical solution, including printed circuit boards, includes: (1) a tray for holding the chemical solution, with the tray having an open top which is configured to receive a horizontally-oriented workpiece, with the tray having a top edge with a portion of the edge forming a dam over which the solution may flow and an opening in its lower portion where the solution can enter the tray, (2) a reservoir tank situated below the tray, (3) a feed line connecting the reservoir tank and tray opening, (4) a drain that returns the solution that overflows the tray top edge to the reservoir tank, and (5) a pump that circulates the solution from the tank to the tray and over the horizontally situated workpiece.

11 Claims, 7 Drawing Sheets

HIGH EFFICIENCY PLATING APPARATUS AND METHOD

BACKGROUND OF THE INVENTION

1. Field of the Invention

The present invention relates to equipment and methods for coating and electroplating objects. More particularly, this invention relates to a method and apparatus for coating and electroplating objects such as printed circuit boards.

2. Description of the Related Art

The plating of objects, such as printed circuit boards (PCBs), may be accomplished by various processes. For PCBs having holes, an initial step or process is often required to coat or plate the holes so as to provide a conductive electrical path on the hole surfaces.

This metal deposition step, often called "electroless plating," does not rely on the typical electric fields that are associated with electroplating processes. Therefore, this metal deposition step is generally considered harder to regulate than a regular electroplating process. Thus, rather than use such an electroless plating technique to fully plate an object such as a PCB, after a base of conductive metal plating is applied by electroless means, the object is moved to an electroplating process for greater speed and control of the further addition of conductive material to the surfaces of the object.

In a conventional metal deposition process, the object to be coated is immersed in various chemical solutions. For PCBs, this usually involves positioning the PCBs vertically (i.e., with their printed surfaces and the direction of the axis of their holes facing sideward), clamping them at an upper or lower edge, and lowering them into a open-top tank for treatment, then raising them from such tanks after the treatment is complete. As a complete coating usually will require a number of treatments, including rinsing, coating, washing, etc., the PCBs usually have to be transported from tank to tank of different chemical solutions.

Such tanks can often take up considerable floor space, require large quantities of chemicals to fill them to the depths necessary to allow the PCBs to be fully immersed and often require sizable ventilation hoods and air cleaning systems to address the safety concerns associated with utilizing such chemicals in open-top tanks. These factors are some of the disadvantages of such metal deposition processes.

One of the most commonly used electroplating processes for adding conductive material to such coated objects is also an immersion type of process. It involves an open-top tank filled with plating solution or electrolyte. Electrodes are placed in the tank, sometimes referred to as a plating bath, and a voltage is applied to the electrodes to set up an electric field in the tank. A power supply that has a variable voltage and amperage control is used to create the voltage between the electrodes. One electrode, called the anode, is attached to the positive terminal of a power supply. The other electrode, called the cathode, is attached to the negative or ground terminal of the power supply. The object to be plated is connected to the negative side of the power supply and, in effect, the object becomes the cathode side of the circuit. The plating material will deposit on the cathode side of the circuit.

The electrolyte consists of a chemical solution where the plating material, usually a metal, is dissolved and suspended in the liquid as metal ions. When the electric field is applied, the metal ions deposit on the cathode and increase its thickness over time until the process is halted or the solution is exhausted. If the liquid is quiescent with no liquid currents or agitation, the electrolyte in the liquid layer immediately adjacent to the plated surface will become depleted of ions. The rate of metal ion deposition will slow down by an order of magnitude unless the electrolyte is agitated or some other means is used to deliver fresh electrolyte. Agitation is also used to dislodge and sweep away bubbles that sometimes form on the plating surface. The bubbles, typically hydrogen, form as a consequence of the deposition process and the bubbles will obstruct plating and create pinholes and non-uniform thickness in the plating.

In such an electroplating process, the objects to be plated, e.g., PCBs, are also usually positioned vertically, clamped on an edge and lowered into an open-top tank of electrolyte for treatment. As with metal deposition, such an electroplating process will often include a number of steps (e.g., rinsing, plating, etching, washing), with the objects to-be-plated being transported from tank to tank of differing, specified solutions.

Thus, it often proves to be the case that such electroplating processes have the same disadvantages as previously seen for the metal deposition process, i.e., their tanks take up considerable floor space, require large quantities of chemicals to fill them to the depths necessary to allow the PCBs to be fully immersed and often require sizable ventilation hoods and air cleaning systems to address the safety concerns associated with utilizing such electrolytic solutions in open-top tanks.

Because of these disadvantages, there exists a continuing need for improved metal deposition and electroplating methods and apparatus.

b 3. Objects and Advantages

There has been summarized above, rather broadly, the prior art that is related to the present invention in order that the context of the present invention may be better understood and appreciated. In this regard, it is instructive to also consider the objects and advantages of the present invention.

It is an object of the present invention to provide a method and apparatus that yields more efficient and lower cost metal deposition and electroplating of objects, e.g., PCBs.

It is an object of the present invention to provide a method and apparatus for metal deposition and electroplating of objects that requires less floor space than that required by prior art methods and apparatus utilizing open-top tanks.

It is an object of the present invention to provide a method and apparatus for metal deposition and electroplating of objects that requires lesser quantities of chemicals than that required by prior art methods and apparatus utilizing open-top tanks.

It is an object of the present invention to provide a method and apparatus for metal deposition and electroplating of objects that requires smaller-size air cleaning systems than that required by prior art methods and apparatus utilizing open-top tanks.

These and other objects and advantages of the present invention will become readily apparent as the invention is better understood by reference to the accompanying summary, drawings and the detailed description that follows.

SUMMARY OF THE INVENTION

The present invention is generally directed to satisfying the needs set forth above and overcoming the limitations and problems identified with prior metal deposition and electroplating processes that utilize open-top tanks.

In accordance with one preferred embodiment, the present invention takes the form of an apparatus for treating plate-like workpieces with a designated chemical solution, including printed circuit boards. This apparatus includes: (1) a tray for holding the chemical solution, with the tray having an open top which is configured to receive a horizontally oriented workpiece, with the tray having a top edge with a portion of the edge forming a dam over which the solution may flow and an opening in its lower portion where the solution can enter the tray, (2) a reservoir tank situated below the tray, (3) a feed line connecting the reservoir tank and tray opening, (4) a drain that returns the solution that overflows the tray top edge to the reservoir tank, and (5) a pump that circulates the solution from the tank to the tray and over the horizontally situated workpiece.

In another preferred embodiment, the present invention further includes a housing having interior top and bottom surfaces, sidewalls and an open front. The tray is slidably attached to the interior sidewalls of the housing in such a manner that the tray may be pulled from the housing front while maintaining the horizontal orientation of the tray. Meanwhile, the reservoir tank is attached proximate the housing's bottom interior surface.

In yet another embodiment of the present invention, the treatment being administered to the workpiece is electroplating utilizing an electrolytic solution. In this embodiment, the apparatus further includes: (1) a conductive plating rack configured to receive and mount the workpiece so that the workpiece may act as a cathode when the rack is immersed in the tray and surrounded by an electrolytic solution, (2) a filter material configured to sit horizontally within the tray and to filter the solution as it flows from the bottom to the top of the tray, (3) a frame to which the edges of the filter material are attached, (4) a porous, planar anode configured to sit horizontally within the tray and above the tray opening and below the filter material and its frame, and (5) electrical connection means attached respectively to the anode and plating rack that a power source to be connected across this circuit. This embodiment may also use a housing to assemble a number of these trays so that they can slide out from the front of such a housing.

Additionally, other embodiment of the present invention consist of various methods for practicing these treatment methods utilizing the apparatus of the present invention.

Thus, there has been summarized above, rather broadly, the present invention in order that the detailed description that follows may be better understood and appreciated. There are, of course, additional features of the invention that will be described hereinafter and which will form the subject matter of any eventual claims to this invention.

DESCRIPTION OF THE PREFERRED EMBODIMENT

For purposes of explanation and not limitation, specific details are set forth below in order to provide a thorough understanding of the present invention. However, it will be apparent to one skilled in the art that the present invention may be practiced in other embodiments that depart from these specific details. In other instances, detailed descriptions of well known methods, hardware, etc. are omitted so as not to obscure the description of the present invention with unnecessary detail.

Figure 1:
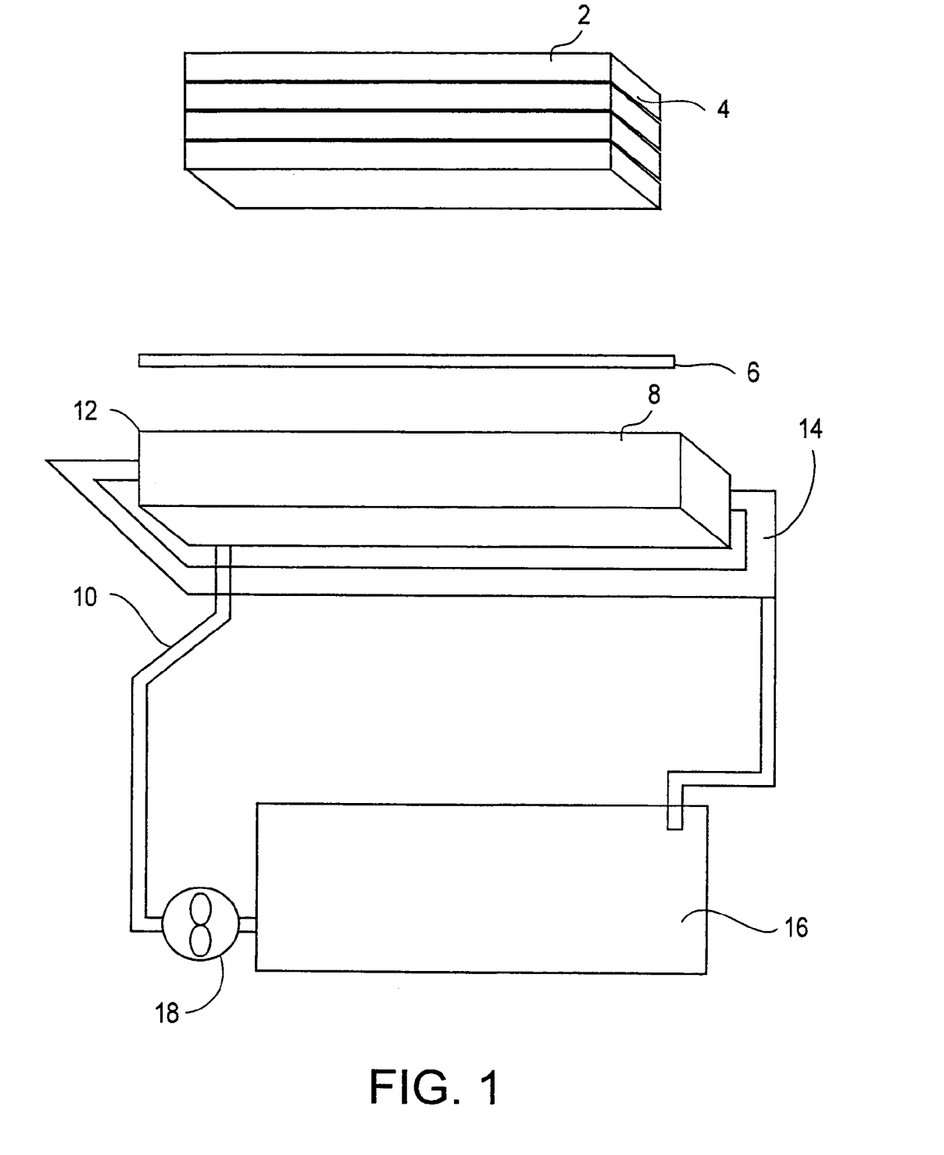
FIG. 1 provides a perspective view of the immersion tray assembly used with a preferred embodiment of a plating method of the present invention.
Figure 2:
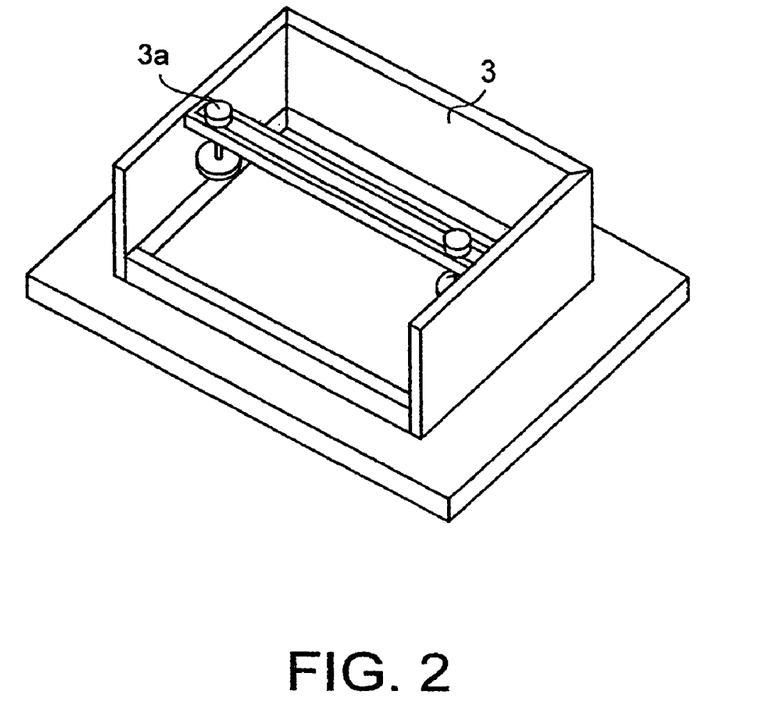
FIG. 2 illustrates a clamping device suitable for use in stacking and clamping board-like materials which are to be plated using the present invention.
Figure 3:
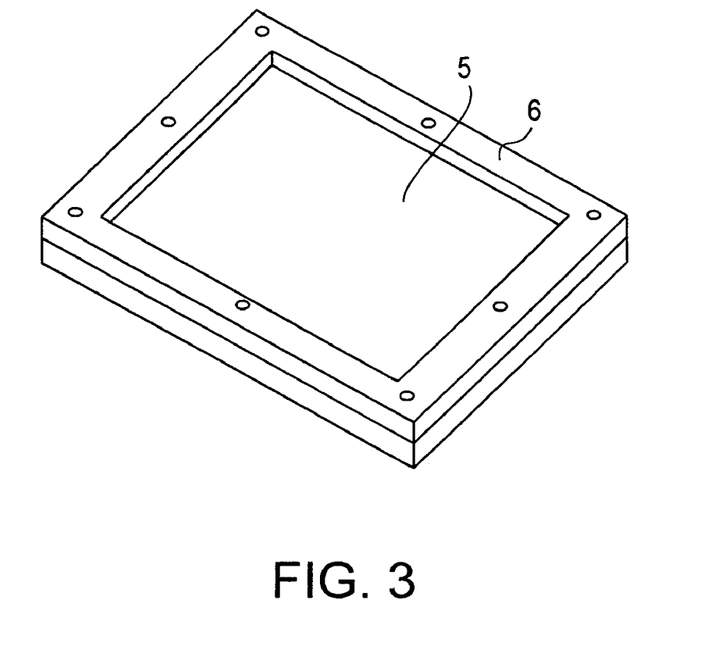
FIG. 3 illustrates a filter material and frame suitable for use with the present invention.

Referring now to the drawings which show a preferred embodiment of the present invention and wherein like reference numerals designate like elements throughout, FIG. 1 is seen to provide a perspective view of a key aspect of a preferred embodiment of the plating method of the present invention for treating thin, porous, plate-like workpieces (e.g., PCB). The materials to be treated, which for illustrative purposes we take to be PCBs 2, are positioned horizontally, with the tooling holes in the corners of the PCBs being used to carefully align the holes of the PCBs. These are stacked and clamped together. FIG. 2 illustrates a clamping device 3, having a thumb screw 3*a*, which is suitable for this purpose. Such a stack 4 is then placed on top of an optional filter material 5 and support frame 6. See FIG. 3.

This filter material 5, frame 6 and its stack 4 are then immersed into a relatively shallow, box-like, open-top container or tray 8 containing a specified chemical solution. At the bottom of the tray, there is an opening 10 which allows a chemical solution to be pumped into the tray. The entering solution flows up through the tank and overflows the edges 12 of the tray where it is collected by a drain 14 which returns the solution to a collection tank 16 located below the tray. A pump 18 and feed line 19 connected to this collection tank serves to circulate the solution through the tray.

In another preferred embodiment of the present invention, the a portion of sides bottom of the shallow tray 8 and the top of the clamp 3 for the stack 4 are configured so that they can be sealed together so that the only flow path for the solution entering the bottom of the tray 8 is to flow through the holes in the PCBs. This serves to increase the flow rate through the holes of the PCBs and greatly expedites the metal deposition process occurring on the hole surfaces.

Since more than one type of chemical solution is needed in such metal deposition processes, trays such as that described above are configured so that they can act and function as pull-out drawers situated within a larger frame or housing 20. Many well-known means (e.g., slide rails, 20*a*) exist for providing such pull-out-drawer capabilities for the trays. When assembled in a housing 20, these trays 8 may be situated so that they sit one on top of the other or with one tray beside another. An exhaust hood connection 21 on the top of the housing allows for an air cleaning system to be attached to the housing so that it can vent the fumes coming from the open-top trays. It should be noted that the top tray's open top sits in close proximity to the housing's top surface so as to minimize the extent of the fumes that can escape into the environment surrounding the housing. See FIG. 4.

For trays containing the same chemical solution, a single pump and collection tank can serve these trays. Similar pumps and collections tanks can serve other trays that contain the same type of chemical solution.

Figure 4:
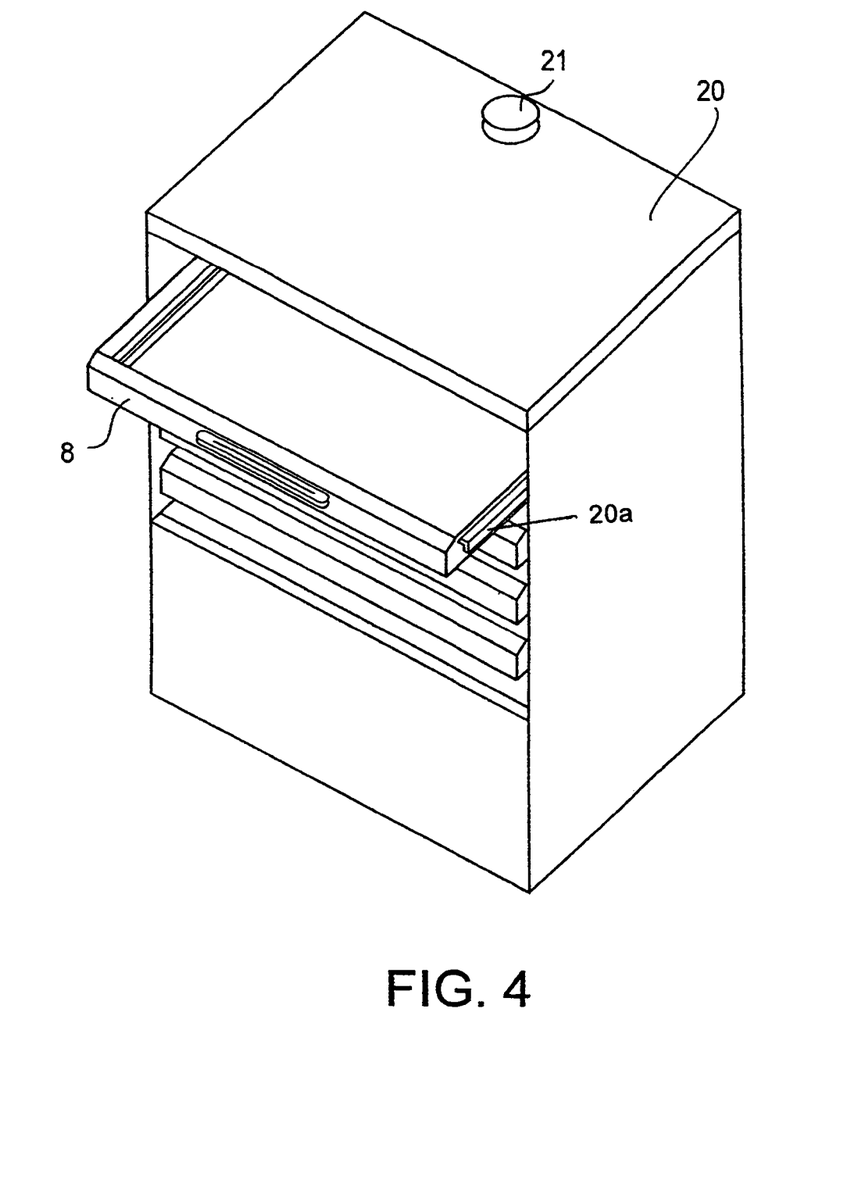
FIG. 4 illustrates a perspective view of a frame or housing assembly having multiple pull-out, drawer-like trays of various plating solutions.

The proximity of the drawer-like trays 8 in the housing 20 makes it easy for a technician to quickly move the frames 6 and their stacked PCBs from one tray to another as the PCBs move through the various immersion steps in such a metal deposition or plating process.

Since the prior art for electroplating processes also involves the use of multiple, large, open-top immersion tanks, an embodiment of the present invention is also directed to an improved electroplating process which eliminates the use of such large immersion tanks.

Figure 5:
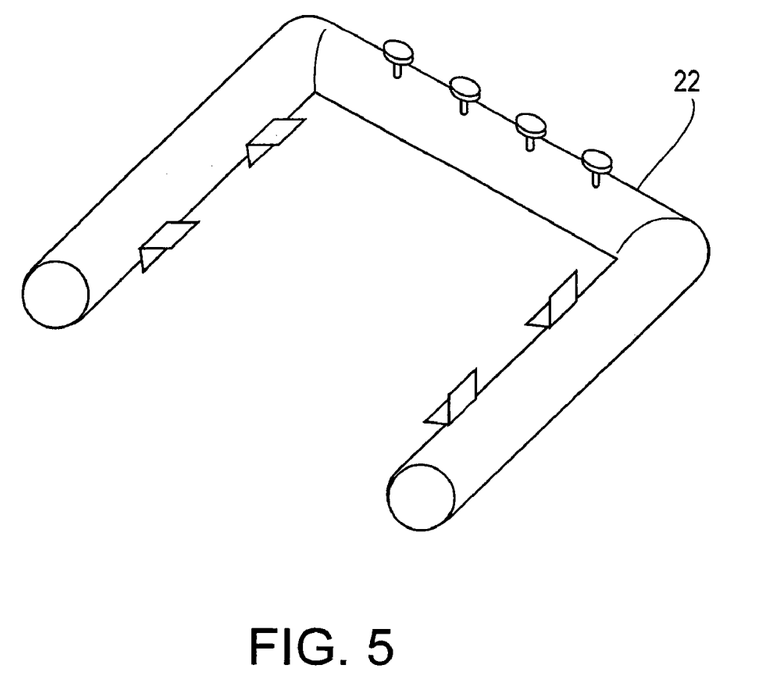
FIG. 5 illustrates a plating rack suitable for use with a preferred electroplating process of the present invention.

With electroplating, each object or PCB must be racked or wired so that it serves as a cathode for the electric circuit used in the process. FIG. 5 illustrates a plating rack 22 suitable for use with the present invention. An anode 24 for the present invention takes the preferred form of a porous, flat member that is preferably fabricated from copper sheet. A porous, filter-like material 26 and its frame 28 are used to separate the PCB 2 to be plated from contact with the anode 24. A filter material suitable for this application is made by assembling various layers of woven materials. For example, a preferred embodiment uses No. 232 mesh, polyester screens to sandwich an approximately 0.25 inch layer of 200 micron, pore size polypropylene filter material. Other similar materials which are suitable for this use are in the range of 40–500 mesh polyester screens and polypropylene filter materials having pore sizes in the range of 50–500 microns.

A PCB 2 to-be-plated, after being fixed in its plating rack 22, is positioned horizontally so that it can be placed on top of the filter material 26 which rests on or above the anode 24 which is also positioned horizontally. This assembly is then placed on a ledge 27 of a shallow, immersion tray 30 containing the electrolyte. See FIG. 6 for a cross-sectional view of such an arrangement and FIG. 7 for the drawer assembly itself.

Figure 6:
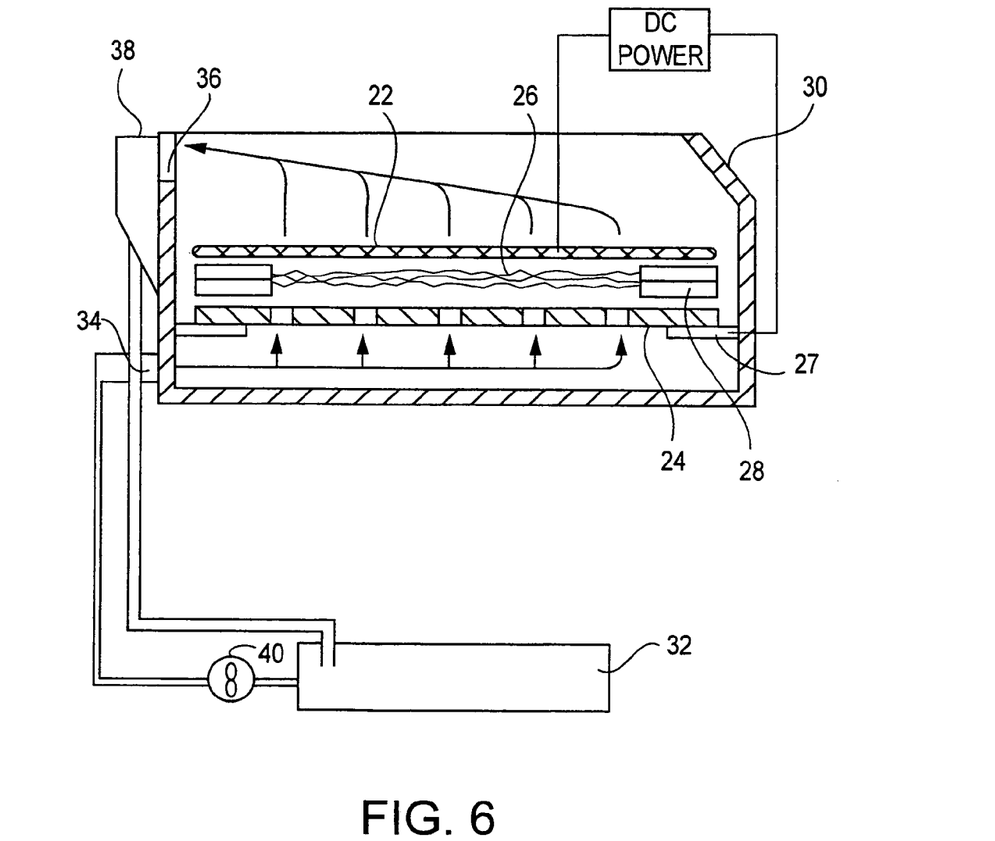
FIG. 6 provides a side view of the materials that are used in an immersion tray assembly which is suitable for use with a preferred embodiment of an electroplating method of the present invention.
Figure 7:
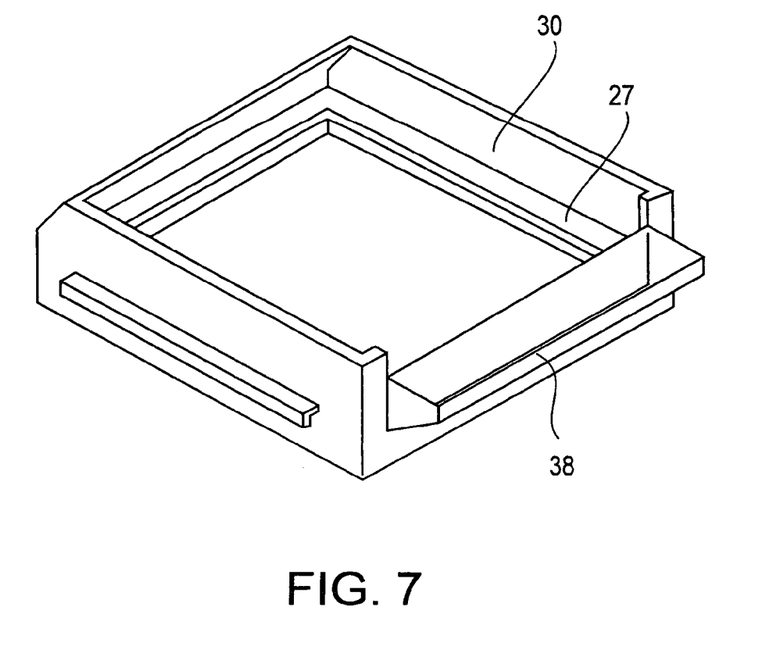
FIG. 7 is a perspective view of a drawer assembly suitable for use with the present invention.

Because of the close proximity of the to-be-plated PCB to the anode, one finds that plating times can be significantly reduced if the solution in proximity to the PCB is circulated so as to avoid allowing the solution proximate to the PCB to become depleted of ions. This is accomplished by recirculating the solution between a collection tank 32 beneath the tray 30 and the tray itself.

Despite significant recirculation, since there is only one anode in this electroplating arrangement, it is found that preferential plating does occur on the side with no anode. This can be overcome by turning over the PCB in the middle of its plating cycle, or by adding a top anode.

To further improve the uniformity of the ions in proximity to a to-be-plated object, other standard solution mixing features can be utilized, e.g., vibration of the object or air agitation of the electrolyte.

An opening 34 in the bottom of the tray 30 allows the electrolyte to be pumped into the tray. The entering electrolyte flows up through the tray and overflows an edge 36 at the back of the tray where it is collected by a drain 38 which returns the electrolyte to the collection tank 32 located below the tray. A pump 40 connected to this collection tank serves to recirculate the electrolyte through the tray.

To minimize the floor space requirements for such an electroplating arrangement, multiple trays such as that described above are configured so that they can act and function as pull-out drawers situated within a larger frame or housing 20. Many well-known means exist for providing such pull-out-drawer capabilities for the trays. When assembled in a housing 20, these trays 30 may be situated so that they sit one on top of the other or with one tray beside another. Such an arrangement is similar to that previously seen FIG. 4. In such an arrangement, a single pump and collection tank can serve many electroplating trays situated within a single frame.

Additionally, it can be seen that the pull-out nature of the drawer-like trays 30 in such a housing 20 again makes it easy for a technician to efficiently remove a PCB and check on the extent and uniformity of its plating.

The above described embodiments of the present invention are seen to significantly overcome many of the problems identified with prior art plating methods (e.g., open-top tanks take up considerable floor space, require large quantities of chemicals to fill them to the depths necessary to allow the PCBs to be fully immersed and often require sizable ventilation hoods and air cleaning systems to address the safety concerns associated with utilizing chemical solutions in open-top tanks). For example, some of the projected savings utilizing the embodiment described above (in the form of a housing having five, 22"×30"×4" drawers that can each accommodate two 12"×18" PCBs in 11.5 gallons of solution) versus a conventional open-top tank immersion system are: Quantity of Chemical Solutions Required—Reduced from 500 to 80 gallons, Quantity of Anode Material Required—Reduced from 700 lbs. of phosphorous-based hook-shaped anodes to 100 lbs. of copper sheet material from which the thin, porous anodes are fabricated, and Quantity of Filter Material Required—Reduced from approximately 40 square feet for ten, standard-size anode bags to 15 square feet of specialty filter material.

The foregoing descriptions of the invention have been presented for purposes of illustration and description. Further, the description is not intended to limit the invention to the form disclosed herein. Consequently, variations and modifications commensurate with the above teachings, and combined with the skill or knowledge in the relevant art are within the scope of the present invention.

The preferred embodiments described herein are further intended to explain the best mode known of practicing the invention and to enable others skilled in the art to utilize the invention in various embodiments and with various modifications required by their particular applications or uses of the invention. It is intended that the appended claims be construed to include alternate embodiments to the extent permitted by the current art.

I claim:

1. An apparatus for treating plate-like workpieces with a designated chemical solution that is made to flow around said workpieces, including printed circuit boards, said apparatus comprising:

a plurality of trays for holding said flowing chemical solution, each tray having an open top which is configured to receive said plate-like workpiece when said workpiece is oriented so that its largest-surface-area surface is oriented horizontally, said tray having a top edge with a portion of said edge forming a dam over which said solution flows, an opening in the lower portion of said tray where said solution enters said tray at a point that is below the bottom of where said workpiece sits when said workpiece is horizontally situated in said tray, an anode is configured to sit within each tray, a reservoir tank situated below said tray, a feed line connecting said reservoir tank and said tray opening, a drain that returns said solution that overflows said tray top edge to said reservoir tank; and a housing having interior top and bottom surfaces, sidewalls and an open front, wherein said plurality of trays are attached to the interior sidewalls of said housing, and wherein said reservoir tank is attached proximate said bottom interior surface.

2. An apparatus as recited in claim 1, wherein said workpieces having top and bottom surfaces and holes that run between said surfaces, said holes located on said workpieces so that said holes can be aligned when said workpieces are stacked one upon the other, said apparatus further comprising:

a clamping device for aligning said workpieces so that their holes align and holding said workpieces in said aligned and stacked orientation, with said clamping device configured to sit in the bottom of said tray while holding said workpieces.

3. An apparatus as recited in claim 1, wherein each tray is slidably attached to the interior sidewalls of said housing in such a manner that said tray may be pulled from said housing while maintaining the horizontal orientation of said tray.

4. An apparatus as recited in claim 3, wherein each tray is slidably attached to the interior sidewalls of said housing in such a manner that said tray may be pulled from said housing while maintaining the horizontal orientation of said tray.

5. An apparatus as recited in claim 1, wherein said treatment is electroplating and said solution is an electrolytic solution, said apparatus further comprising:

a conductive plating rack configured to receive and mount said workpiece so that said workpiece may act as a cathode when said rack is immersed in said tray and surrounded by said electrolytic solution, said plating rack configured to sit horizontally within said tray, a filter material configured to sit horizontally within said tray and to filter said solution as it flows from the bottom to the top of said tray, and an anode configured to sit within said tray so that said anode is situated above said tray opening and below said filter material.

6. An apparatus as recited in claim 5, said apparatus further comprising:

a frame to which the edges of said filter material are attached, said frame configured to sit horizontally within said tray below said plating rack that holds said workpiece.

7. An apparatus as recited in claim 5, wherein each tray is slidably attached to the interior sidewalls of said housing in such a manner that said tray may be pulled from said housing while maintaining the horizontal orientation of said tray.

8. An apparatus as recited in claim 1, wherein said housing exterior surface having an opening for an exhaust hood connection that is configured so as to allow an air cleaning system to be connected to said housing for venting said fumes from said plurality of trays.

9. An apparatus as recited in claim 8, wherein each tray is slidably attached to the interior sidewalls of said housing in such a manner that said tray may be pulled from said housing while maintaining the horizontal orientation of said tray.

10. An apparatus as recited in claim 9, wherein said treatment is electroplating and said solution is an electrolytic solution, said apparatus further comprising:

a conductive plating rack configured to received and mount said workpiece so that said workpiece may act as cathode when said rack is immersed in said tray and surrounded by said electrolytic solution, said plating rack configured to sit horizontally with said tray, a filter material configured to sit horizontally within said tray and to filter said solution as it flows from the bottom to the top of said tray, and an anode configured to sit within said tray so that said anode is situated above said tray opening and below said filter material.

11. An apparatus as recited in claim 10, said apparatus further comprising:

a frame to which the edges of said filter material are attached, said frame configured to sit horizontally within said tray below said plating rack that holds said workpiece.

* * * * *